United States Patent
Meinke et al.

(10) Patent No.: US 8,107,211 B2
(45) Date of Patent: Jan. 31, 2012

(54) HIGH TEMPERATURE SUPERCONDUCTING ELECTROMECHANICAL SYSTEM WITH FREQUENCY CONTROLLED COMMUTATION FOR ROTOR EXCITATION

(75) Inventors: Rainer Meinke, Melbourne, FL (US); Philippe Masson, West Melbourne, FL (US); Sasha Ishmael, Melbourne, FL (US)

(73) Assignee: Advanced Magnet Lab, Inc., Palm Bay, FL (US)

( * ) Notice: Subject to any disclaimer, the term of this patent is extended or adjusted under 35 U.S.C. 154(b) by 824 days.

(21) Appl. No.: 12/200,964

(22) Filed: Aug. 29, 2008

(65) Prior Publication Data
US 2009/0085511 A1    Apr. 2, 2009

Related U.S. Application Data

(60) Provisional application No. 60/968,591, filed on Aug. 29, 2007, provisional application No. 61/130,649, filed on Jun. 2, 2008.

(51) Int. Cl.
*H02K 3/02* (2006.01)
*H02P 23/00* (2006.01)

(52) U.S. Cl. ............ 361/141; 361/19; 318/818

(58) Field of Classification Search ........ 318/818; 361/18, 19, 139–143; 310/179; 505/705; 335/299; 336/212, 234; 242/443, 445.1; 29/602.1, 605, 606
See application file for complete search history.

(56) References Cited

U.S. PATENT DOCUMENTS

| | | | |
|---|---|---|---|
| 3,197,680 A | | 7/1965 | Wingerson |
| 3,568,002 A | * | 3/1971 | Robins et al. ............ 361/141 |
| 3,761,752 A | | 9/1973 | Anderson |
| 3,835,369 A | * | 9/1974 | Zoleta ............ 323/328 |
| 4,096,403 A | * | 6/1978 | Rabinowitz et al. ........ 310/10 |
| 4,283,687 A | | 8/1981 | Madey |
| 4,639,708 A | | 1/1987 | Weatherly |
| 5,777,420 A | | 7/1998 | Gamble et al. |
| 5,965,959 A | | 10/1999 | Gamble et al. |
| 6,278,212 B1 | | 8/2001 | Kalsi |
| 6,489,701 B1 | | 12/2002 | Gamble et al. |

(Continued)

FOREIGN PATENT DOCUMENTS

CA    968398    5/1975

(Continued)

OTHER PUBLICATIONS

R.B. Meinke, M.J. Ball, C.L. Goodzeit, "Superconducting Double-Helix Accelerator Magnets", IEEE Proceedings of the 2003 Particle Accelerator Conference, 2003, vol. 3, pp. 1996-1998.

(Continued)

*Primary Examiner* — Eduardo Colon
(74) *Attorney, Agent, or Firm* — Ferdinand M. Romano; Beusse, Wolter, Sanks, Mora & Maire, P.A.

(57) ABSTRACT

A system and method for generating a magnetic field in a rotating machine. In one embodiment, a primary winding assembly is configured to generate a rotatable magnetic field. The assembly is connected to receive multiple signals of different phases to effect field rotation. A set of secondary windings is positioned for generation of current based on magnetic coupling during the field rotation. The secondary windings include conductor capable of supporting superconducting current flow. A rotatable machine includes a stator and a rotor winding coupled for rotation with respect to the stator. The secondary windings are formed in a circuit for providing superconducting current through the rotor winding.

20 Claims, 10 Drawing Sheets

U.S. PATENT DOCUMENTS

| | | |
|---|---|---|
| 6,597,082 B1 | 7/2003 | Howard et al. |
| 6,791,216 B2 * | 9/2004 | Kalsi ............................... 310/52 |
| 6,809,618 B2 | 10/2004 | Leghissa et al. |
| 6,921,042 B1 | 7/2005 | Goodzeit et al. |
| 6,946,936 B2 | 9/2005 | Schauwecker et al. |
| 6,958,898 B2 | 10/2005 | Reis et al. |
| 7,064,550 B2 | 6/2006 | Shen |
| 7,068,133 B2 | 6/2006 | Reis |
| 7,345,457 B2 * | 3/2008 | Garces et al. .................. 322/59 |
| 7,889,042 B2 * | 2/2011 | Meinke ......................... 336/200 |
| 7,990,247 B2 * | 8/2011 | Meinke ......................... 336/222 |
| 2002/0171521 A1 * | 11/2002 | Ries ............................. 335/216 |
| 2003/0184427 A1 | 10/2003 | Gavrilin |
| 2004/0155538 A1 * | 8/2004 | Kalsi ............................... 310/52 |
| 2004/0232792 A1 * | 11/2004 | Erfourth .................. 310/156.38 |
| 2006/0103385 A1 | 5/2006 | Shen |
| 2007/0120435 A1 * | 5/2007 | Laskaris et al. ............... 310/178 |
| 2007/0159140 A1 * | 7/2007 | Garces et al. .................. 322/59 |
| 2008/0048902 A1 * | 2/2008 | Rylov et al. ................... 341/155 |
| 2009/0206974 A1 * | 8/2009 | Meinke ......................... 336/224 |
| 2009/0289753 A1 * | 11/2009 | Meinke ......................... 336/222 |
| 2009/0295168 A1 * | 12/2009 | Meinke et al. ................... 290/55 |
| 2010/0283318 A1 * | 11/2010 | Crane et al. ..................... 307/9.1 |
| 2011/0127874 A1 * | 6/2011 | Frank et al. ................... 310/194 |
| 2011/0148238 A1 * | 6/2011 | Goodzeit et al. ............. 310/126 |
| 2011/0227677 A1 * | 9/2011 | Coombs ........................ 335/284 |

FOREIGN PATENT DOCUMENTS

| | | |
|---|---|---|
| EP | 0353153 | 1/1990 |
| EP | 0954009 A | 11/1999 |
| FR | 2550026 A | 2/1985 |

OTHER PUBLICATIONS

C.L. Goodzeit, R.B. Meinke, et al., "High Power Density Marine Propulsion Motors with Double-Helix Coils" Applied Superconductivity Conference, Aug. 27-Sep. 1, 2006, Seattle, WA.

C.L. Goodzeit, R.B. Meinke, M.J. Ball, "A Superconducting Induction Motor Using Double-Helix Dipole Coils", IEEE Transactions on Applied Superconductivity vol. 13 No. 2 Jun. 2003, pp. 2235-2238.

L.J.M. van de Klundert and H.H.J ten Kate, "Fully Superconducting Rectifiers and Fluxpumps Part:1 Realized methods for pumping flux", IPC Business Press Ltd, 1981.

L.J.M. van de Klundert and H.H.J ten Kate, "On Fully Superconducting Rectifiers and Flux Pumps a Review. Part 2: Communication Modes, Characteristics and Switches", IPC Business Press Ltd, 1981.

Ball, MJ et al, Modulated Double Helix Quadrupole Magnets, IEEE Transactions on Applied Superconductivity, IEEE Service Center Los Alamitos CA, US vol. 13, No. 2—Jun. 1, 2003, pp. 1369-1372.

Ball, MJ et al, "The Double Helix dipole—a novel approach to Accelerator Magnet Design" IEEE Transactions on Applied Superconductivity, IEEE Service Center Los Alamitos, CA, US, vol. 13, No. 2—Jun. 1, 2003, pp. 1365-1368.

* cited by examiner

HIGH TEMPERATURE SUPERCONDUCTING ELECTROMECHANICAL SYSTEM WITH FREQUENCY CONTROLLED COMMUTATION FOR ROTOR EXCITATION

RELATED APPLICATION

This application claims priority to provisional patent application U.S. 60/968,591 filed 29 Aug. 2007 and provisional patent application U.S. 61/130,649, filed 2 Jun. 2008 which are each incorporated herein by reference in the entirety.

FIELD OF THE INVENTION

The invention relates to superconducting rotating machinery and, more particularly, to design and operation of machinery which incorporates a flux pump transformer to create a superconducting current in a winding thereof.

BACKGROUND OF THE INVENTION

There is a continuing desire to commercialize superconducting rotating machines because superconducting motor and generator operation can result in relatively high efficiencies above 99% and more than an order of magnitude very high specific power than conventional machines. Use of High Temperature Superconductor (HTS) materials, i.e., materials which exhibit superconduction at temperatures above 30 K, for superconducting machinery has been demonstrated, and such conduction is referred to herein as conduction in a HTS state. To improve the potential for commercial use of such machines numerous efficiency limitations should be overcome. Note, for example, losses occur during delivery of power from a 300 K environment to the superconducting windings. In motor drive applications it is also necessary to generate and replenish current in the HTS windings. HTS conductors differ from low temperature superconductors in that it is not possible to establish a true persistent current loop with an HTS conductor. This is due to several factors including finite losses characteristic of HTS materials and characteristic resistive losses across splice junctions present in the circuitry. These small but significant losses must be considered when creating or restoring current levels with flux pump circuitry.

In the past flux pumps have been of two varieties. It has been possible to directly feed a charging current into a cryogenically cooled loop from a power supply operating in a normal mode. Losses through the conductor extending across the interface are significant. Alternately, flux pump transformers can transfer power into cryogenically cooled environment while maintaining substantial thermal isolation. However, flux pump transformer designs must provide rectification of the ac transformer signal to charge the low loss direct current loop needed in the rotor winding. It is desirable to provide a system incorporating such a flux pump function which is effective during various modes of machine operation.

SUMMARY OF THE INVENTION

In embodiments according to the invention, a rotatable machine system includes a stator assembly and a rotor assembly. The rotor assembly is configured to rotate within or about the stator assembly and includes at least one rotor winding formed of material capable of operating in a superconducting state. A flux pump includes a primary winding assembly and a circuit incorporating the rotor winding. The circuit includes a secondary winding assembly positioned to rotate about or within the primary wiring assembly. The secondary wiring assembly is rotatable at a variable frequency when the rotor assembly rotates. The primary wiring assembly is electrically coupled to generate a rotatable magnetic field having a variable frequency of rotation with respect to the primary wiring assembly. The frequency at which the magnetic field generated by the primary winding rotates is controllable to contemporaneously differ from the variable frequency at which the secondary winding assembly rotates to create an electromotive force in the secondary winding assembly.

According to an embodiment, a system for generating a magnetic field with a superconducting winding includes a set of primary windings configured to generate a rotatable magnetic field. The primary windings are connected to receive multiple signals of different phases to effect field rotation. A set of secondary windings is positioned for generation of current based on magnetic coupling during the field rotation. The secondary windings include conductor capable of supporting superconducting current flow. A rotatable machine includes a stator and a rotor winding coupled for rotation with respect to the stator. The secondary windings are formed in a circuit for providing superconducting current through the rotor winding.

A method is provided for operating a system of the type comprising a rotor winding rotatable with respect to a stator. A transformer is provided, comprising a plurality of primary windings and at least first and second secondary windings. The secondary windings are rotatable at a first variable frequency. A rotor coil is provided which comprises material capable of conduction in a High Temperature Superconducting state. A rotating magnetic field is generated about the primary windings at a second frequency of rotation to induce a superconducting current in the first and second secondary windings The coil is connected through switchable elements to alternately conduct superconducting current generated in the first and second secondary windings and provide direct current through the rotor coil. The switchable elements each operate at a frequency determinative of a time varying difference between the first and second frequencies of rotation.

A method is provided for operating an electromechanical machine having a rotor, a stationary stator and a flux pump transformer. According to one embodiment, a current is generated in a circuit path extending through a winding of the rotor by generating, in a primary winding assembly of the flux pump transformer, a magnetic flux which rotates at a variable first frequency to induce a time varying emf in secondary windings of the flux pump transformer. Contemporaneously the secondary windings rotate at a time varying second frequency with respect to the stationary stator. The first frequency is controlled with respect to time variation of the second frequency to induce an emf in the secondary windings as a function of the difference between the time varying first and second frequencies.

Embodiments of the invention may advantageously incorporate Double Helix (DH) technologies as described in the following documents all of which are assigned to the assignee of the present invention and are hereby incorporated into this application by reference: "Concentric Tilted Double-Helix Dipoles And Higher-Order Multipole Magnets" U.S. Pat. No. 6,921,042; "Structure For A Wiring Assembly And Method Suitable For Forming Multiple Coil Rows With Splice Free Conductor" U.S. application Ser. No. 12/061,870 filed 3 Apr. 2008; "Method Of Reducing Multipole Content In A Conductor Assembly During Manufacture" U.S. application Ser. No. 12/133,676 filed 5 Jun. 2008.

Use of DH configurations in high field magnets leads to low inductance coils and, for a given energy, higher currents are required relative to requirements of conventional magnets such as race track coil designs. Feeding a superconducting magnet with large current through current leads results in a high thermal load and requires a large power supply. Embodiments of the invention advantageously incorporate superconducting double helix coils fed with a flux pump, this allowing for contactless current generation in the HTS persistent current mode magnet. It is to be understood that use herein of the term HTS persistive current mode is in the context of HTS superconductive loops and means a current loop capable of sustaining a superconductive current for a limited period of time due to very low, but non-zero resistive conditions relating to characteristic losses in HTS materials. Reference to an HTS persistive current mode is not the same as what is meant by conduction in a persistent current loop formed with a low temperature superconductor.

HTS machine designs which incorporate DH winding configurations and HTS flux pump transformers according to the invention permit high current, HTS persistent current mode operation for a rotor. This simplifies quench protection, which is of particular importance for superconducting windings based on HTS conductor. HTS splices required to form flux pump circuitry can remain superconducting to sustain a HTS persistive current mode. $MgB_2$ is an exemplary HTS material with which these benefits can be achieved. With no current leads required between room and cryogenic temperature levels, heat loads of the machine and efficiency can be optimal.

Rotor windings and transformer coils formed with DH technologies offer unmatched mechanical robustness and electrical strength of the windings at low manufacturing costs. Unique stress management in the DH winding configuration enables high current densities in the superconductor, resulting in high air gap flux density and therefore high power density. For example, the DH winding technology enables coils capable of enduring large Lorentz forces due to their self-stabilizing, solenoidal configuration. Also, larger bending radii associated with DH geometries generates permit winding of brittle HTS materials in the manufacture of electrical machines. High rotor currents of several kA are possible, leading to reduced rotor inductance. Low rotor inductance facilitates current adjustments for synchronous condenser operation and also simplifies quench protection of the machine.

Like reference numbers are used throughout the figures to denote like components. Numerous components are illustrated schematically, it being understood that various details, connections and components of an apparent nature are not shown in order to emphasize features of the invention. Various features shown in the figures are not shown to scale in order to emphasize features of the invention.

DETAILED DESCRIPTION OF THE INVENTION

Before describing in detail the embodiments of a system and a method according to the invention, it is noted that the present invention resides primarily in a novel and non-obvious combination of components and process steps. So as not to obscure the disclosure with details that will be readily apparent to those skilled in the art, certain conventional components and steps have been omitted or presented with lesser detail, while the drawings and the specification provide greater emphasis on other elements and steps pertinent to understanding the invention. Further, the following embodiments do not define limits as to structure or method according to the invention, but provide examples which include features that are permissive rather than mandatory and illustrative rather than exhaustive.

Figure 1:
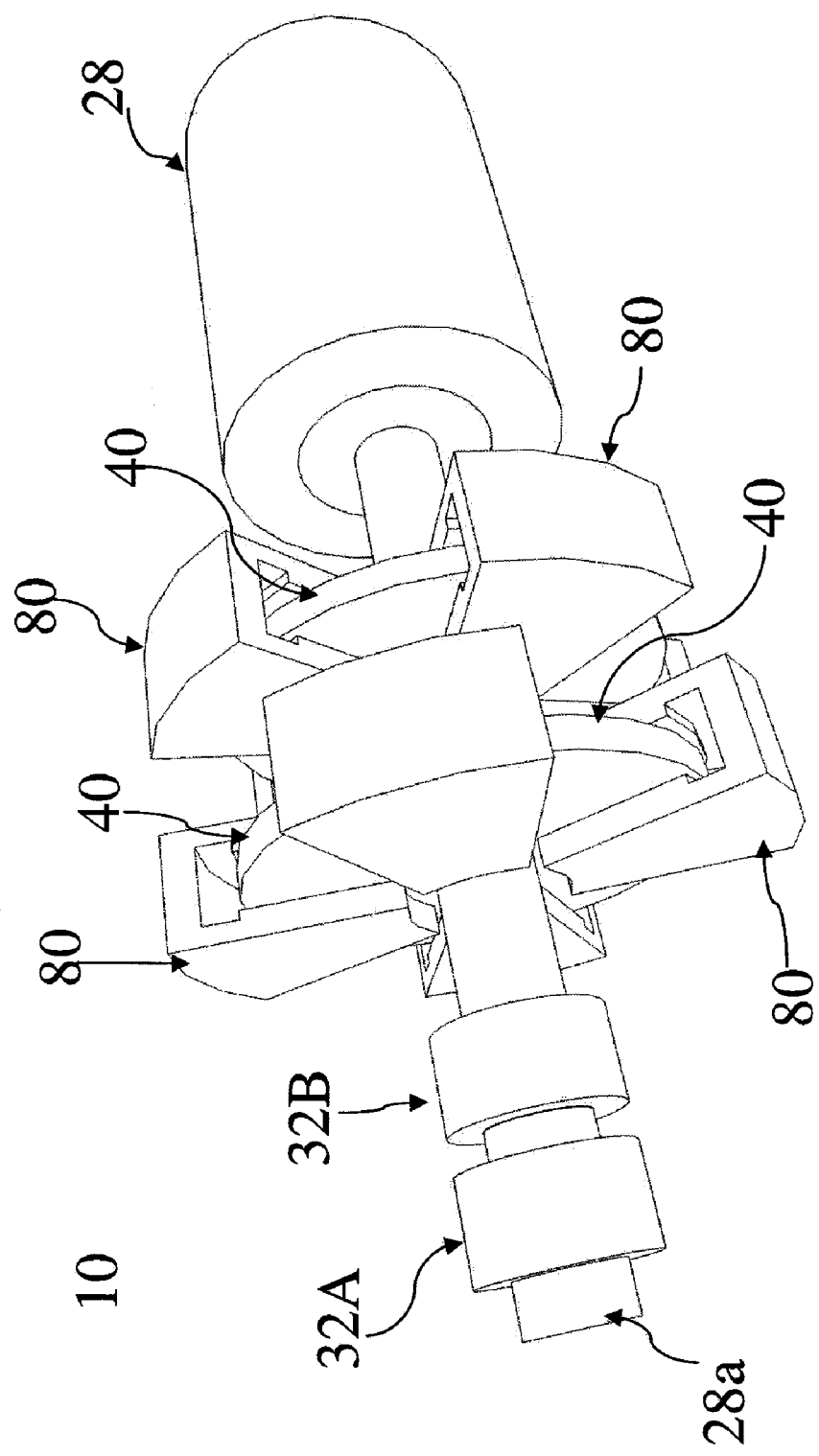
FIG. 1 provides a partial perspective view of a motor system according to the invention.
Figure 2:
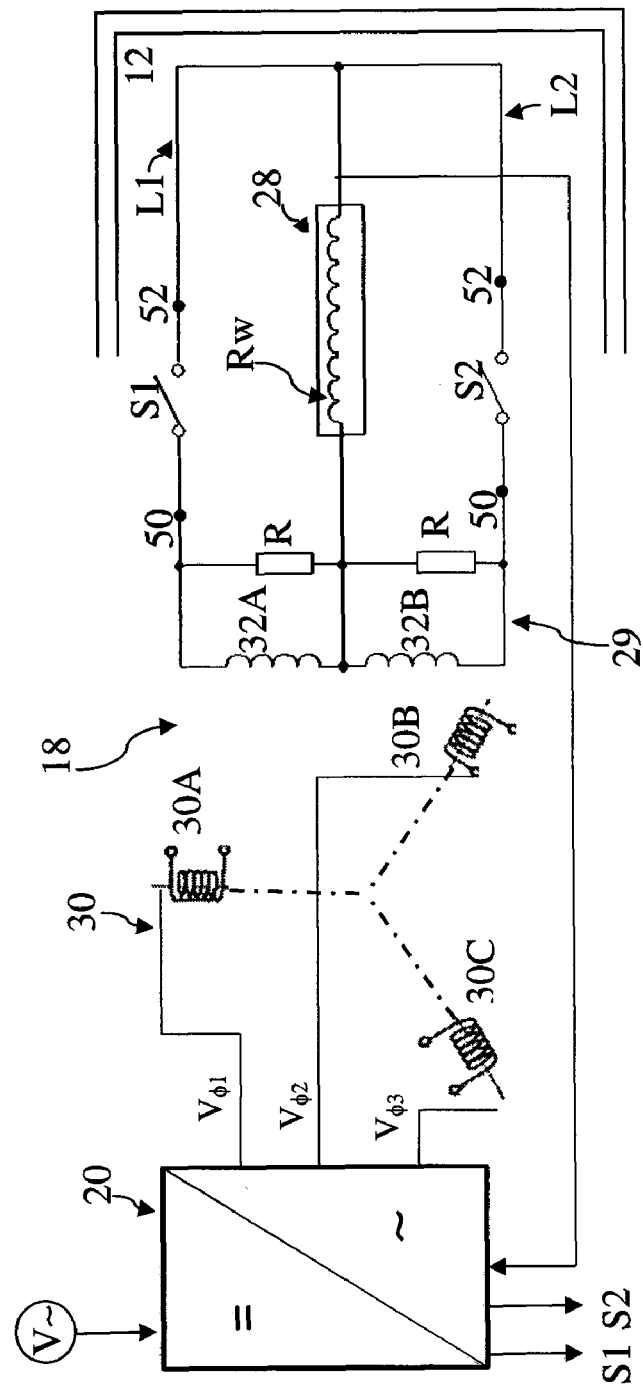
FIG. 2 is an equivalent circuit illustrating features of a flux pump incorporated in the system of FIG. 1.

FIG. 1 is a simplified partial perspective view of a motor system 10 according to an example embodiment of the invention. FIG. 2 is an equivalent circuit illustrating features of a flux pump 12 of the system 10 used to charge and sustain an HTS persistent current mode in a loop therein. Conventional components such as enclosures and associated cryogenic cooling hardware are not shown in order to better illustrate features of the invention.

Figure 3:
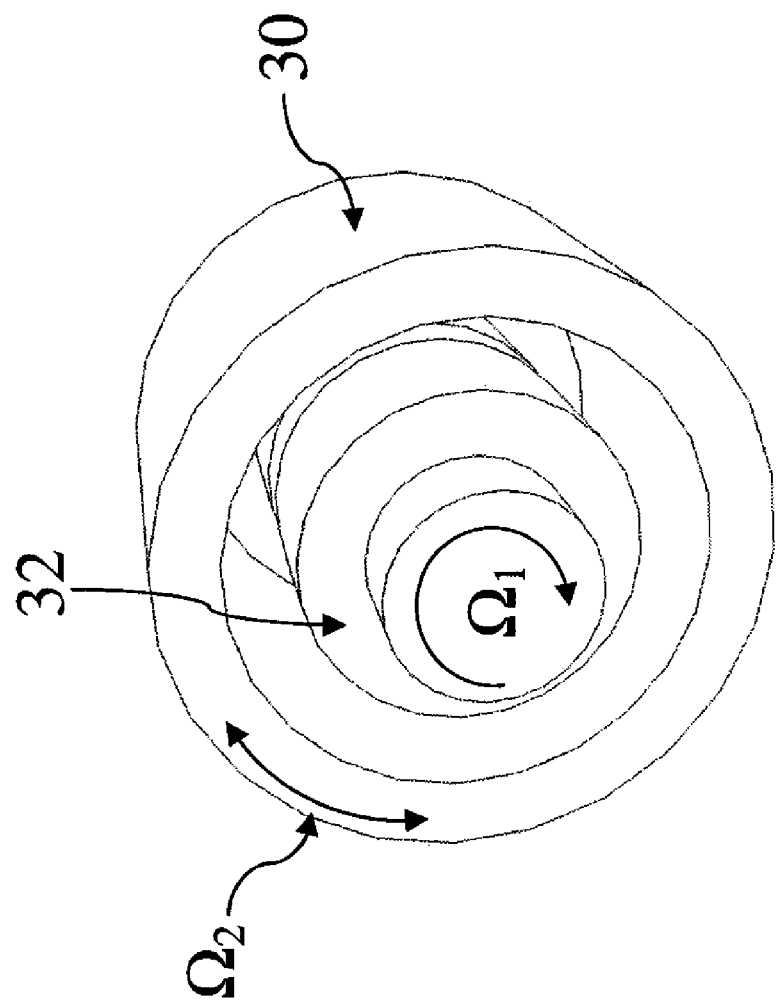
FIG. 3 is an end perspective view of the system of FIG. 1 further illustrating the physical arrangement of components shown in the circuit of FIG. 2.

The flux pump 12 includes a transformer 18 coupled to control electronics 20 to receive three phases $V\phi_1$, $V\phi_2$ and $V\phi_3$ of an ac supply voltage V for which the alternating frequency and magnitude are controllable, these parameters being set by the electronics 20. FIG. 2 illustrates presence of a stator 26 positioned about a rotor 28 and coupled to receive a supply voltage (not shown) to effect operation as an induction motor in accord with conventional principles. With reference to FIG. 1, the rotor 28 is positioned about a rotatable shaft 28a. An exemplary winding $R_w$ of the rotor 28 is illustrated as a component in a circuit 29 of the flux pump 12 which carries a persistent current. The rotor shaft 28a extends beyond the stator 26 and rotor 28 to provide mechanical rotation of secondary windings associated with the flux pump 12 as now explained. FIG. 3 provides an end perspective view of the system 10 further illustrating an arrangement of transformer components about the rotor shaft 28a.

The exemplary flux pump transformer 18 includes a non-rotating primary winding assembly 30 and a secondary winding assembly 32 in a rotating transformer configuration. By rotating transformer it is meant that the transformer includes a first winding assembly mounted for rotation on a rotor shaft relative to a second winding assembly. As described herein, the transformer 18 is capable of generating a rotating field in the second winding assembly. In the example embodiment, like the stator 26, the primary winding assembly 30 is a stationary component. The assembly 30 is positioned about a secondary wiring assembly 32 for magnetic coupling therewith. The assembly 32 is mounted on the rotor shaft 28a for rotation with the shaft. The secondary wiring assembly 32 operates in a high temperature superconducting (HTS) state at cryogenic temperatures. By high temperature superconducting state it is meant that the associated wiring superconducts at temperatures above of 20 K.

The primary winding assembly 30 has three windings 30A, 30B and 30C operable in a normal conducting mode, with each winding connected to receive a different phase $V\phi_1, V\phi_2$ and $V\phi_3$, respectively, of the supply voltage V. During operation the primary winding assembly 30 provides a time varying rotating flux which couples to a pair of secondary windings 32A and 32B of the secondary winding assembly 32. In this example, the assembly 30 is made of copper wire conductor operable in a normal, i.e., non-superconducting, mode. The secondary windings 32A and 32B are formed in a magnetic dipole configuration to maximize coupling with the primary winding assembly 30. They may be formed in a double helix (DH) configuration to minimize the number of splices and facilitate manufacturing, but may also be conventional, e.g., racetrack shaped, windings. Although illustrated as separately formed windings, the windings 32A and 32B may be formed about the same core in, for example, a DH arrangement wherein different layers contain wire associated with different windings. Similarly, the windings 30A, 30B and 30C of the assembly 30 may be formed about one core of a DH configuration with each winding positioned in a different set of layers.

As the secondary windings 32A and 32B rotate with the shaft 28a they cut the magnetic flux $\Phi$ generated by the primary winding assembly 30. Variation of flux through the secondary windings induces an electromotive force (emf), creating an alternating current. The frequency of the induced current is linked to the relative rotational speed of the rotor shaft with respect to the primary field. Voltage, $V_s$, induced in the secondary winding assembly, is the time derivative of the flux $\Phi$ resulting from alternating current flow in the primary winding assembly 30:

$$V_s = -d\Phi/dt.$$

Figure 4:
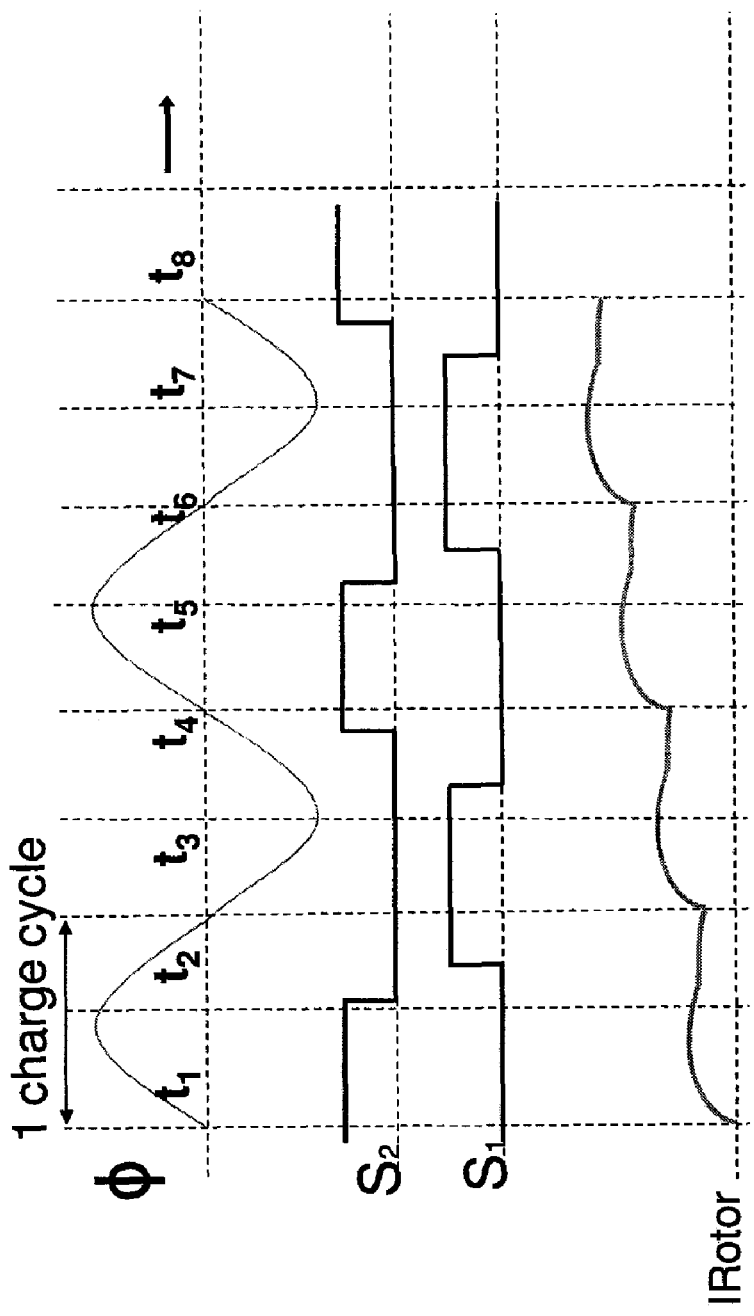
FIG. 4 is a timing diagram describing function of the flux pump circuit shown in FIG. 2.

See FIG. 4, which illustrates the time varying current Ip in primary winding 32A, of the primary winding assembly and the corresponding voltage Vs. Because the current induced in the secondary windings 32A and 32B is sinusoidal, switches are used to rectify the alternating current and feed direct current to the rotor winding Rw. The windings 32A and 32B are each electrically connected through switches to alternately provide current in a different one of two current loops L1 and L2 of the superconducting charging circuit 29. Current induced in different windings during different halves of each supply voltage cycle is alternately diverted into different ones of the loops L1 or L2 to generate a charge of persistent current which passes through the rotor winding $R_w$. The first and second loops L1 and L2 of conductive material, operating in the HTS state, each include a common portion extending through the rotor winding.

Conduction through the circuit loop L1 is under the control of a superconducting switch S1 positioned in the Loop L1 with the secondary winding 32A. Conduction through circuit loop L2 is under the control of a superconducting switch S2 positioned in the Loop L2 with the secondary winding 32B. The switches S1 and S2 are each set in either an open or a closed state by the control electronics 22. With this arrangement the control electronics can commutate current from one loop L1 or L2 to the other loop. See again FIG. 4. A protection resistor R is placed in parallel with each of the secondary windings 32A and 32B to limit high voltage spikes when the switches change state and to function as quench dump resistors.

Conductor in the superconducting switches S1 and S2 may comprise superconductive Magnesium Diboride ($MgB_2$). Superconductivity is limited to a region of the (B,T,J) space where B is the applied magnetic flux density, T is the temperature and J is the current density. To effect switching, part of the conductor becomes resistive when one or several of the critical parameters (critical temperature Tc, critical field Hc or critical current density Jc) is reached. The three parameters are interdependent. For example, the critical field Hc is lowered when the temperature increases. In addition, temporal changes including dI/dt and dB/dt can reach values which transition the mode to a normal state. Switching may be primarily controlled by varying the magnitude of the magnetic field applied across a segment of $MgB_2$ conductor or dB/dt.

To reduce the requisite magnitude of the critical field Hc needed to perform the switching, the segment of the conductor to be switched normal is operated at a slightly higher temperature than other conductor in the circuit 29. For example, with other components in the circuit operating at 20 K, $MgB_2$ conductor in the switches may be operated at about 30 K. At this elevated temperature, the current carrying capability of $MgB_2$ conductor is degraded and to compensate for this the cross section of conductor has to be increased to provide equivalent current handling capability. As illustrated in FIG. 1, the switches S1 and S2 are modules each comprising a disk 40 having magnetic properties and rotatably coupled to the shaft 28a. The following discussion describes details of the switch S1 with reference is to FIGS. 5-9, but it is to be understood that the design and assembly of switch S2 is identical and details of such will be apparent from the following description of switch S1. Both switches S1 and S2 are mechanically coupled to the rotor shaft 28a for rotation, but the switch positions modulate in accord with signals from the control electronics 22, independent from the rotational speed of the shaft 28a.

Figure 5A:
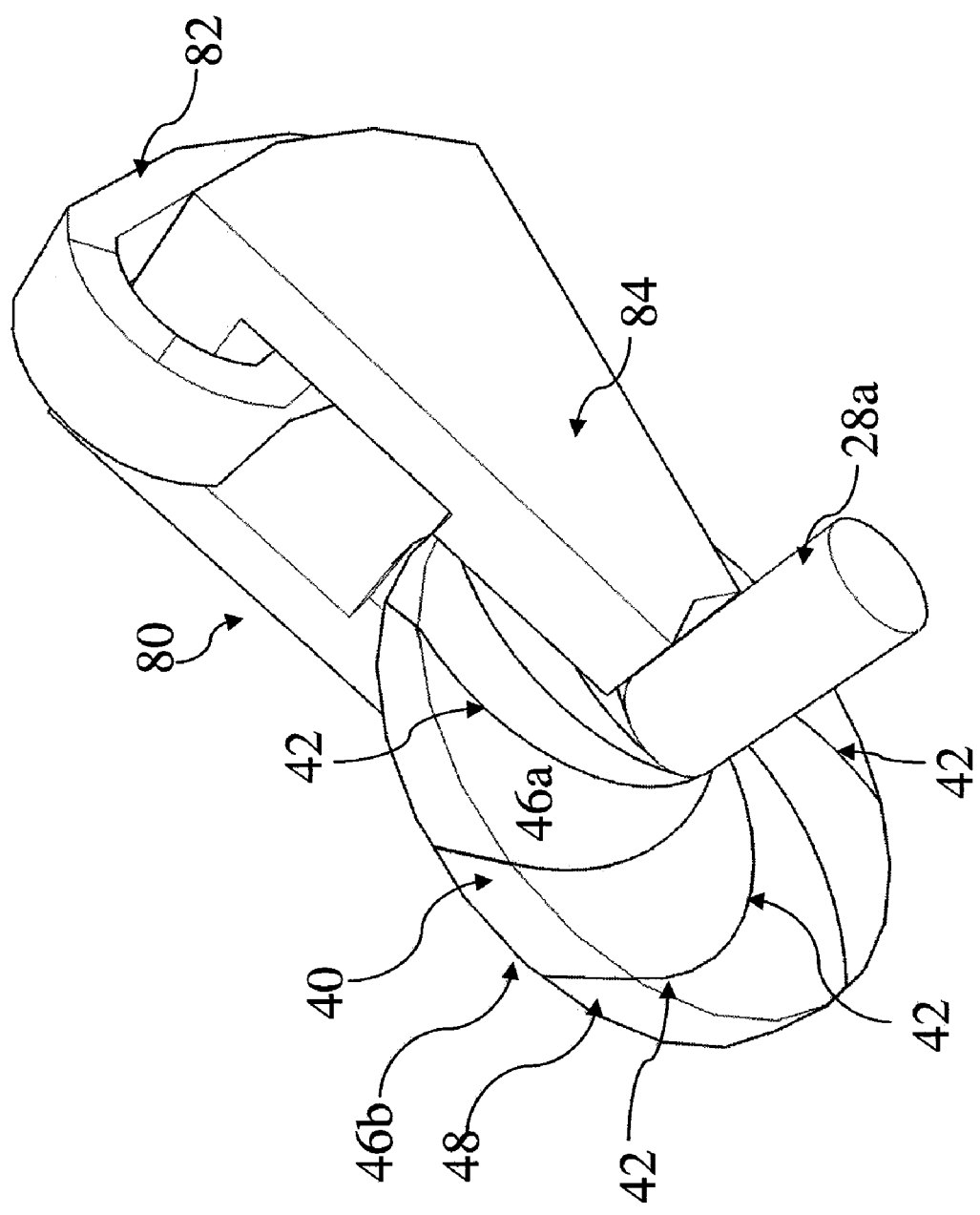
FIG. 5A is a partial illustration of a superconducting switch.
Figure 5B:
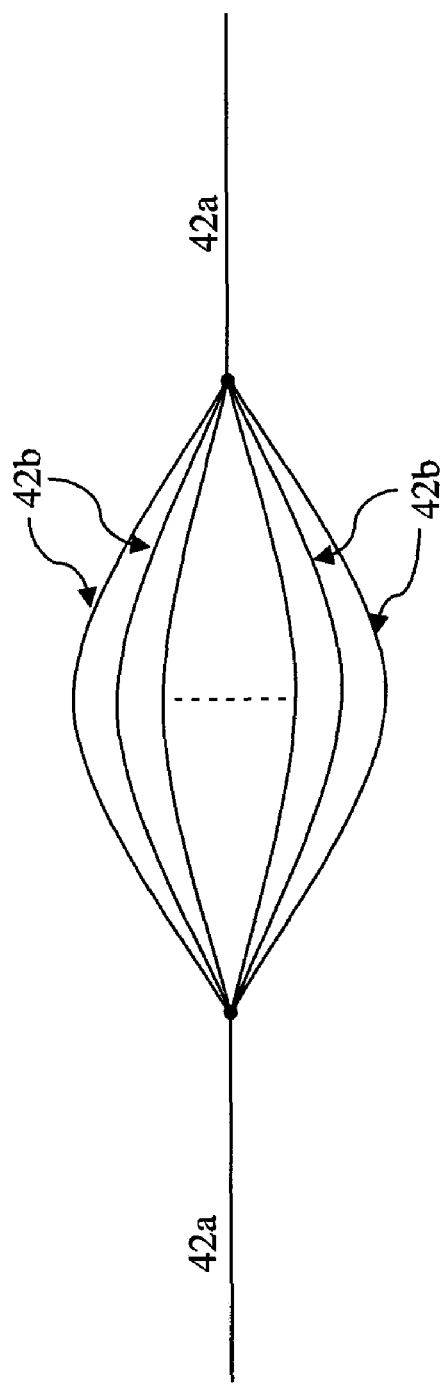
FIG. 5B illustrates a parallel wiring configuration associated with the switch of FIG. 5A.

As shown in the partial illustration of FIG. 5A and the wiring configuration of FIG. 5B, the switch S1 includes a series of $MgB_2$ wires 42 distributed along a pair of opposing major surfaces 46a and 46b of the disk 40 with each wire 42 extending across the outer disk edge 48. The wires 42 form a trunk of parallel conductive paths coupled between splice connections 50 and 52 (see FIG. 2) and about the disk surfaces. The $MgB_2$ wires are shown to be bent in a manner which does not exceed limitations which could adversely affect superconducting properties of the conductor. In order to form the branch of parallel wires 42 at least splice connection 50, 52 is needed on each side of the disk 40. The exemplary connections 50, 52 are be formed along the surface of the shaft 28a on opposing sides of the disk 40, but other suitable locations may be selected. The operating temperature of the wires 42 along the disk 40 is be elevated, e.g., to about 30 K, by introducing eddy current losses and magnetization losses in the conductor matrix and filaments or in the support disk. These effects are present in multifilament $MgB_2$ wire generally but magnetization effects may be more pronounced when the filaments are twisted.

Figure 6:
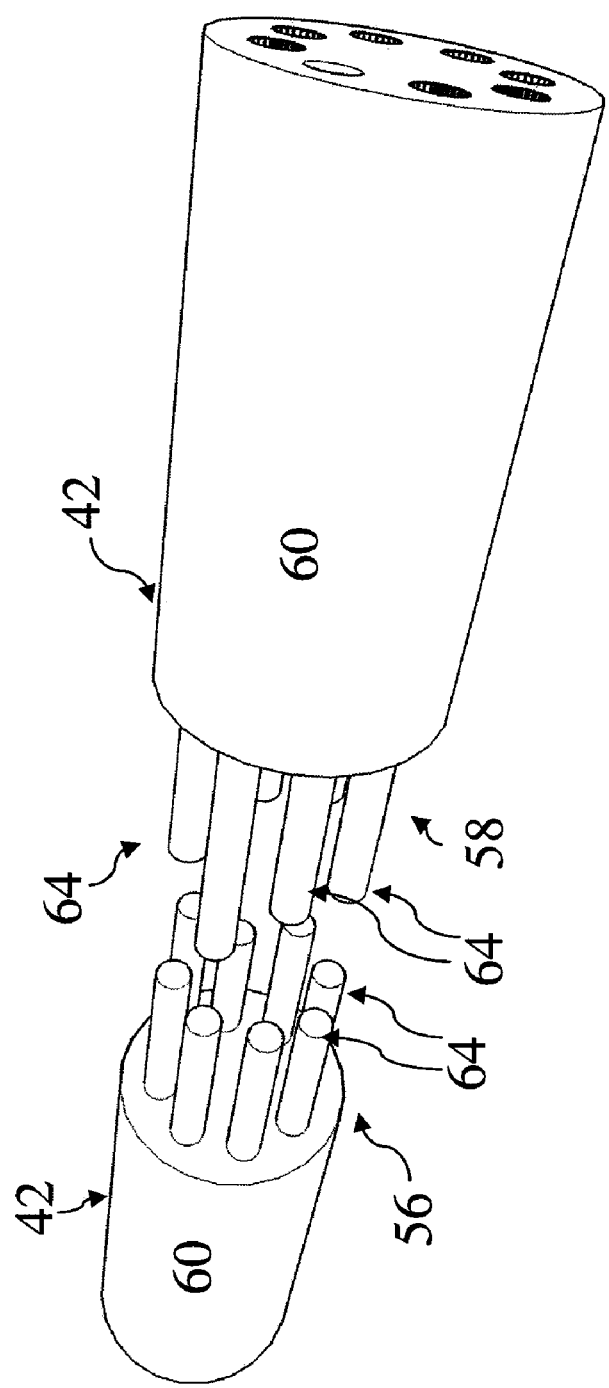
FIG. 6 illustrates a step in a process sequence for forming splice connections among segments of superconductive wire.
Figure 7:
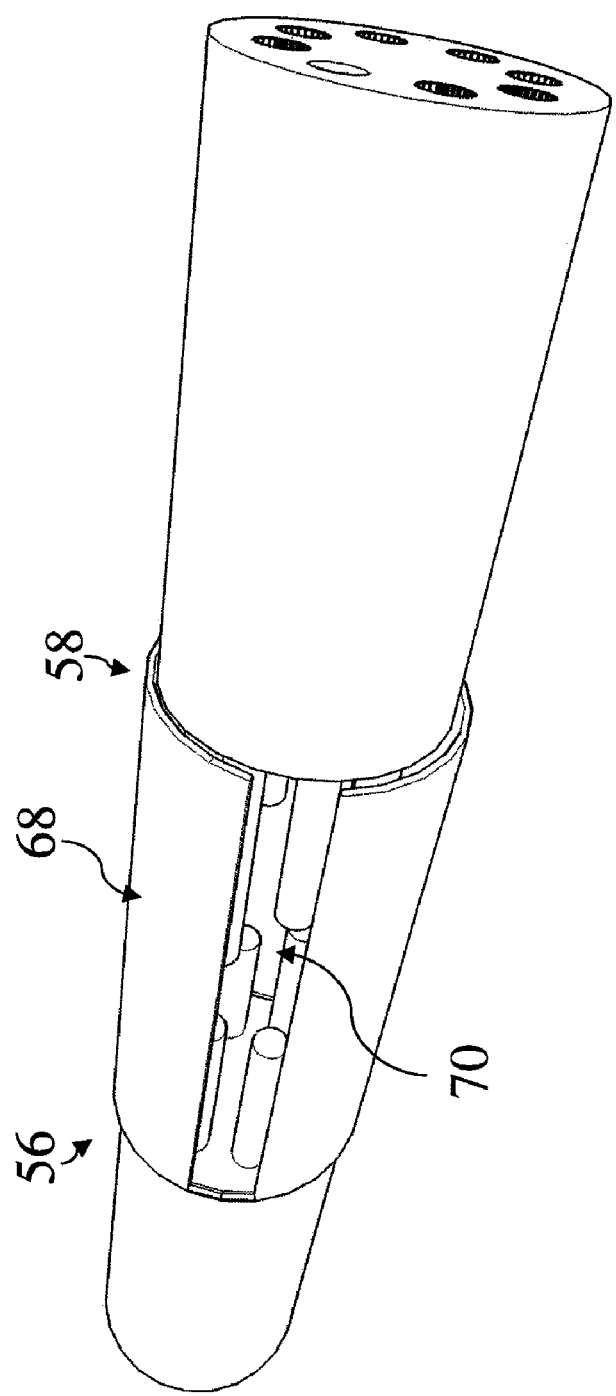
FIG. 7 illustrates another step in a process sequence for forming splice connections among segments of superconductive wire.
Figure 8:
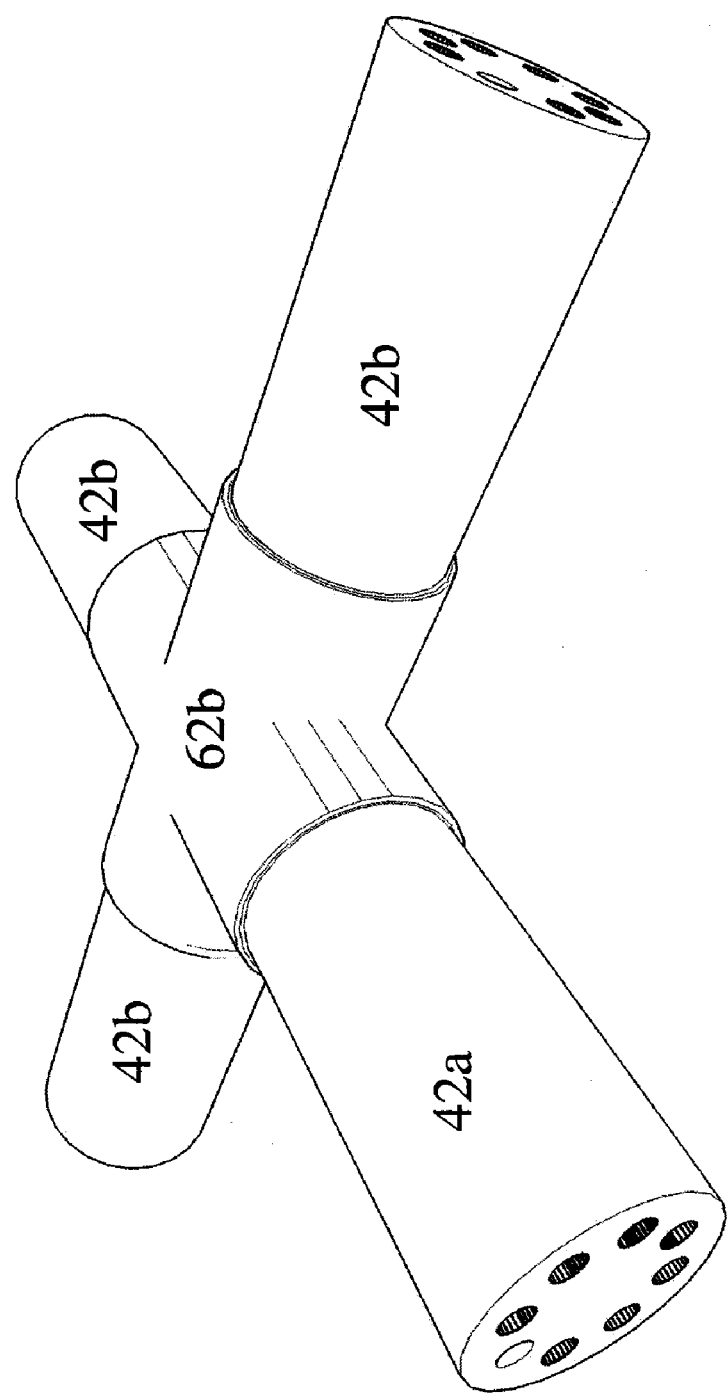
FIG. 8 illustrates still another step in a process sequence for forming splice connections among segments of superconductive wire.
Figure 9:
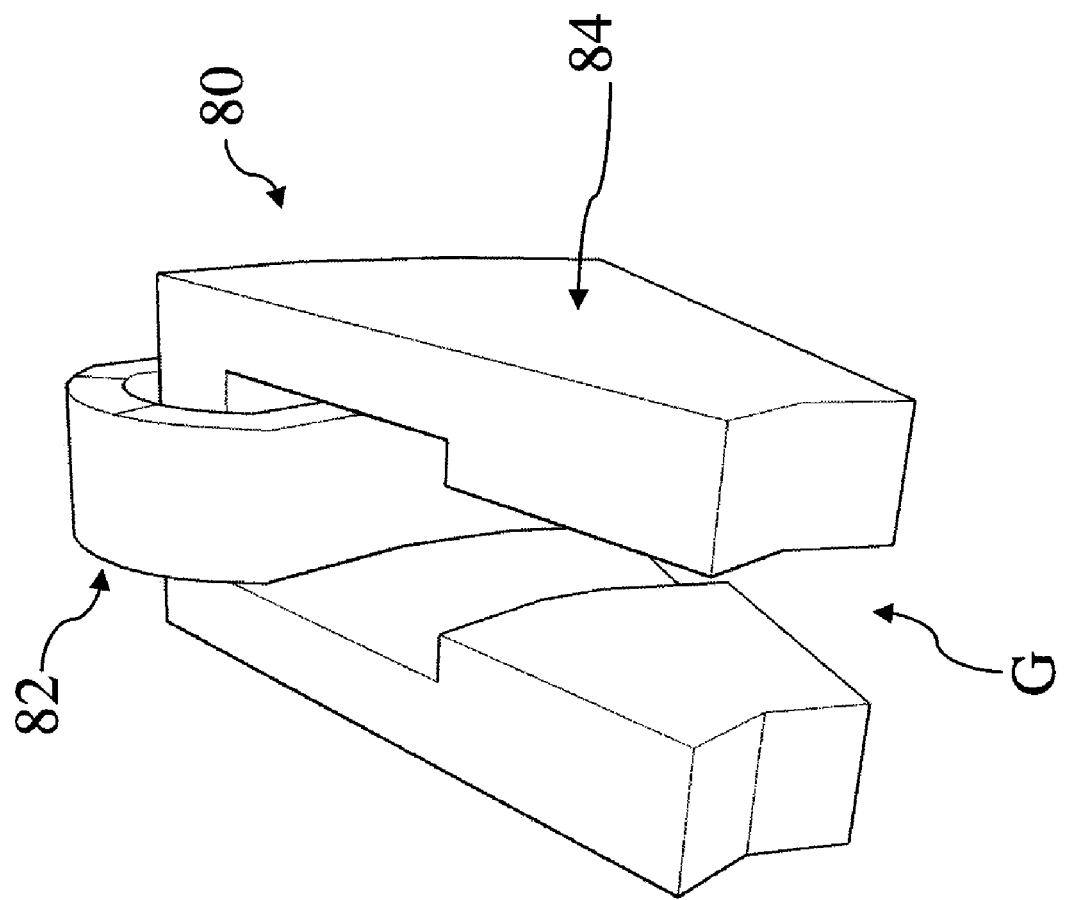
FIG. 9 illustrates a magnetic module incorporated in the switch of FIG. 5A.

FIGS. 6, 7 and 8 illustrate a process for forming the connections 50, 52 between two ends 56, 58 of different $MgB_2$ wires 42. Ultra low resistance splicing, e.g., $10^{-9}$ Ohm, is desirable for HTS operation of the flux pump 12 although higher resistivities on the order of $10^{-7}$ Ohm may be acceptable. The process begins with removing from the ends 56, 58 all material forming the metallic matrix 60 to expose the individual filaments 64 of $MgB_2$ wire. See FIG. 6. This can be achieved with a series of etchants selective toward individual constituents of the matrix 60. For example, iron, nickel and copper can each be removed with varying etch selectivities by etchants known in the art. After the etching is completed short segments (e.g., on the order of one cm) of the $MgB_2$ filaments 64 are exposed in a parallel array at each of the ends 56, 58. Next, the ends 56, 58 are placed adjacent one another along a line as shown in FIG. 6. Although ends of the individual filaments along each end may extend between one another or may contact individual ends in the other end, this is not necessary and the filaments of different ends are shown to be in spaced-apart relation for initiating the splice connection. With reference to FIG. 7, a sheath 68, which may be tubular in shape, is placed around the ends 56, 58, extending from metallic matrix material adjoining each of the ends to create a repository 70 which is filled with unreacted $MgB_2$ powder. Within the volume of the sheath 68 the exposed filaments 64 are in contact with the powder. The tube-shaped sheath is then closed and rolled to compress the powder and a local thermal treatment follows, e.g., using induction heating, to instill superconductive properties through the connection, splice resistance in the range of $10^{-14}$ can be obtained with this method. The described process for creating such a superconductive splice connection can be extended to create connection of three or more $MgB_2$ wires at a single node. See, for example, FIG. 8 which illustrates a branch connection wherein one wire 42a is connected to three wires 42b that form a parallel network suitable for the wiring configuration of FIG. 5B. A four-way compressible sheath 62b effects coupling of the wires 42a and 42b. When the number of wires to be connected exceeds available physical space within the wire diameter, multiple nodes such as shown in FIG. 8, each comprising a separate sheath 62b that connects three or more wires, may be formed in a sequence to fan out a further increase in the number of parallel wires. Thus the configuration shown schematically in FIG. 5B may include a large number of wires 42b. The described splicing method can be used to connect several conductors together at various angles.

Although a process for forming a superconducting splice has been described for $MgB_2$ wire, it is to be understood that even with a conventional solder (Pb) connection positioned between segments of a splice, a resistance on the order of $10^{-9}$ can be achieved for suitable operation of the flux pump circuit. Resistances on the order of $10^{-7}$ appear suitable for operation of the flux pump 12. With reference to FIG. 5A, a network of parallel wires 2 is formed across the disk 40 of each switch S1 and S2, and opening of the switches is controlled by application of magnetic fields. Each switch includes a series of stationary actuating modules 80 formed about the disk 40. Each module 80 includes a coil 82 coupled to generate a field with a laminated iron core 84. The core 84 extends about the disk and along each side 46a and 46b of the disk 40 so that the core includes a gap extending across the disk 40. With this arrangement, when the coil is energized field lines extend through the disk 40. See also FIG. 9 which further illustrates an exemplary structure of a module 80 having a suitable gap G. As seen in FIG. 1 each switch S1, S2 may so incorporate a series of stationary modules 80 about the disk 40. The coil of each module may operate in a normal conduction state, e.g., at room temperature. When the iron core is laminated a pulsed current can be used to generate the magnetic field. Once the field is applied, the conductors 42 exit the superconducting state and become resistive. Transitioning a relatively long length of $MgB_2$ conductor into the normal mode is desired to get provide a significant increase in resistance and improve the dynamics of the switching. The wires 42 will recover to the superconducting state after the current has been switched out of the loop L1 or L2 and into the conducting path of the other loop.

The time needed to open a switch S1, S2 and to recover the superconducting state limits the operating frequency of the switch to a low value, e.g., perhaps below 20 Hz. In the past, the frequency of current induced in the secondary windings of a flux pump transformer has been a function of the rotational speed of the rotor shaft. Despite these constraints, according to the invention it is possible to implement the flux pump 12 while the rotor shaft turns at an arbitrary speed.

To overcome the effects of shaft operating speed, the switching frequency is decoupled from the shaft rotational speed. With the primary assembly 30 incorporating a variable frequency three-phase input to the windings 30A, 30B and 30C, the assembly 30 generates a controllable rotating field. The rotating field generated in the primary assembly is controllable both in terms of rotation speed (frequency) and magnitude (current). A conventional inverted signal based on shaft rpm can be input to the control electronics 22 for determination of adjustments to $V_s$. When the rotational frequency $\Omega_1$ of the shaft 28a and the rotational frequency $\Omega_2$ of the field generated in the primary assembly 30 are the same, no electromotive force (emf) is created in the secondary winding assembly 32. According to the invention, the frequency $\Omega_2$ of the field rotation in the primary assembly 30 can be controlled and set to $$\Omega_2 = (1-s)\Omega_1 (\text{rad}/s).$$

The frequency of the flux variation seen on the secondary windings 32A and 32B is then $s\Omega_1$ where s represents the slip between the two fields. The frequency of the induced emf is $$f = s|\Omega_1|/(2\pi) \text{ (Hz)}$$

for a dipole field and, therefore, the switching frequency is 2f. The value of s can be controlled to keep the switching frequency constant and independent from the rotation speed of the shaft.

During operation the following sequence may be followed in accord with FIG. 4:

1) Switch 1 (S1) is closed while switch S2 open. The switch S2 is effectively "open" since an external magnetic field is being applied to the $MgB_2$ conductor. The flux change in the primary winding assembly 30 induces a voltage in secondary winding 32A which in turn causes a current to flow into loop L1. The load current starts to increase.
2) When current, Ip, flowing through the primary winding assembly 30 reaches a maximum value and levels off, switch S2 is closed. For an instant of time both switches S1 and S2 are closed and current is allowed to commutate from loop L1 to loop L2. The load current may experience a diminutive decline during this period.
3) Next switch S1 is opened while switch S2 remains closed. As the current in the primary winding assembly 30 is ramped back to 0 Amps, the flux direction in the secondary winding 32B is reversed, thus rectifying the voltage induced in winding 32B which produces a current in the direction needed to continue charging the load.
4) This process is repeated until the required current in the load is achieved. After the load is fully charged, operation of the excitation system ceases until the load current needs further adjustment.

A solution which allows for all operating modes of the flux pump 12 to occur while rotating has been described. This rotational operation is based on the underlying principle that a changing flux will induce a current. In this mode a turbine or prime mover drives the shaft supporting the secondary windings of the transformer while the primary winding provides a variable field. The field is controlled to generate an emf in the secondary windings. This enables generation of a desired switching speed for the switches S1 and S2. In one embodiment, the slip s can be held to a relatively constant value while the rotor shaft is changing speed so that the emf induced in the secondary windings is relatively constant and suitable for operation of the superconducting switches. At any speed of shaft rotation the flux pump can provide needed charge to sustain a satisfactory level of persistent current through the winding Rw.

While the invention has been described with reference to particular embodiments, it will be understood by those skilled in the art that various changes may be made and equivalents may be substituted for elements thereof without departing from the scope of the invention. For example, embodiments according to the invention are not limited to the DH configuration but could also be fabricated with conventional coil configurations (in particular "race-track" windings). The system is suitable for but not limited to high current applications. The described excitation system need not be superconducting. On the other hand, the entire system could comprise superconducting DH coils. It is also noted that the field rotations $\Omega_1$ and $\Omega_2$ can be in different directions. The disclosed concepts for rotors and flux pump transformers are applicable to motors and generators, as well as synchronous condensers for reactive power compensation in power grids, where rapid adjustments of rotor currents are required.

$MgB_2$ has been disclosed as a desirable material for HTS machine design. Use of other conductors which can operate at higher temperatures is contemplated although such conductors, e.g., BSCOO and YBCO, may impose significantly higher costs. In order to provide high rotor excitation currents it may be preferred to have a fully superconducting flux pump excited rotor in which the flux pump is based on full wave rectification.

The scope of the invention is only limited by the claims which follow.

We claim:

1. A rotatable machine comprising:
    a stator assembly;
    a rotor assembly configured to rotate within or about the stator assembly and including at least one rotor winding formed of material capable of operating in a superconducting state; and
    a flux pump including a primary winding assembly, and a circuit incorporating the rotor winding, the circuit including a secondary winding assembly positioned to rotate about or within the primary wiring assembly as the rotor assembly rotates, the secondary wiring assembly being rotatable at a variable frequency,
    the primary wiring assembly electrically coupled to generate a rotatable magnetic field having a variable frequency of rotation with respect to the primary wiring assembly, which frequency is controllable to contemporaneously differ from the variable frequency at which the secondary winding assembly rotates to create an electromotive force in the secondary winding assembly.

2. The machine of claim 1 wherein the circuit is configurable to sustain a superconducting current.

3. The machine of claim 1 wherein the secondary winding assembly includes first and second secondary windings each operable in a high temperature superconductive state and each of the secondary windings is operable in accord with a commutation frequency to generate current in a different loop of the circuit to create or replenish a sustainable superconducting current for operation of the rotor winding with the stator assembly.

4. The machine of claim 3 wherein the rotational frequency of the secondary wiring assembly and the rotational frequency of the magnetic field generated by the primary wiring assembly differ based on the commutation frequency.

5. The machine of claim 3 wherein the commutation frequency is equal to $s|\Omega_1|/(2\pi)$ where s is the difference between the variable rotational frequencies of the primary wiring assembly and the secondary wiring assembly, and $|\Omega_1|$ is the absolute value of the rotational frequency of the secondary wiring assembly.

6. The machine of claim 3 wherein:
    the rotational frequency of the secondary wiring assembly varies as a function of rotational frequency of the rotor assembly; and
    the rotational frequency of the magnetic field generated by the primary wiring assembly is controlled based on the rotational frequency of the rotor assembly and the commutation frequency.

7. The machine of claim 1 wherein the circuit is configured for conduction through the rotor winding in a HTS persistive current mode.

8. A system for generating a magnetic field with a superconducting winding, comprising
    a set of primary windings configured to generate a rotatable magnetic field and connected to receive multiple signals of different phases to effect field rotation;
    a set of secondary windings positioned for generation of current based on magnetic coupling during the field rotation, the secondary windings comprising conductor capable of supporting superconducting current flow; and
    a rotatable machine comprising a stator and a rotor winding coupled for rotation with respect to the stator,
    wherein the secondary windings are formed in a circuit for providing superconducting current through the rotor winding.

9. The system of claim 8 wherein the circuit includes conductor comprising HTS $MgB_2$.

10. The system of claim 8 wherein the circuit includes first and second current loops each extending through the rotor winding, each loop including a switch for controlling flow of current through the loop in order to provide rectification relative to frequency of an alternating current in the primary set of windings.

11. The system of claim 10 wherein the switches are formed with splice connections between segments of $MgB_2$ wire.

12. A method for operating a system of the type comprising a rotor winding rotatable with respect to a stator, comprising the steps of:
    providing a transformer comprising a plurality of primary windings and at least first and second secondary windings, the secondary windings being rotatable at a first variable frequency;
    providing a rotor coil comprising material capable of conduction in a High Temperature Superconducting state;
    generating a rotating magnetic field about the primary windings at a second frequency of rotation to induce a superconducting current in the first and second secondary windings; and
    connecting the coil through switchable elements to alternately conduct superconducting current generated in the first and second secondary windings and provide direct current through the rotor coil,
    wherein the switchable elements each operate at a frequency determinative of a time varying difference between the first and second frequencies of rotation.

13. The method of claim 12 including performing the step of generating the rotating magnetic field about the primary windings at a second frequency of rotation while the first and second secondary windings are rotating.

14. The method of claim 12 including performing the step of generating the rotating magnetic field about the primary windings at a second frequency of rotation while the first and second secondary windings are undergoing a change in the first variable frequency.

15. A method of operating an electromechanical machine having a rotor positioned for magnetic coupling with stator and a transformer, comprising creating a current in a circuit path formed with the transformer and extending through a winding of the rotor by:
   generating in a primary winding assembly of the transformer a magnetic flux which rotates at a variable first frequency to induce a time varying flux in secondary windings of the transformer while the secondary windings rotate at a time varying second frequency with respect to the stator, and
   controlling the first frequency with respect to time variation of the second frequency so that the flux is induced in the secondary windings as a function of the difference between the time varying first and second frequencies.

16. The method of claim 15 wherein the circuit path includes first and second HTS loops of conductive material each including a common portion extending through the rotor winding, the method further including provision of switches controlling current flow through each loop at a commutating frequency proportional to the difference between the time varying first and second frequencies.

17. The method of claim 16 wherein the commutation frequency is equal to $s|\Omega_1|/(2\pi)$ where s is the difference between the first and second frequencies and $|\Omega_1|$ is the absolute value of the first frequency.

18. The method of claim 15 wherein the primary winding assembly comprises three coil windings each coupled to receive voltage from a different phase of a three phase variable frequency source, the first frequency with which the flux rotates being the frequency of the source.

19. The method of claim 15 wherein the coil windings in the primary winding assembly and the stator are stationary with respect to one another while the secondary windings rotate at a time varying second frequency.

20. The method of claim 15 wherein the step of creating the current in the circuit path creates a superconductive current subject to non-zero resistive conditions based on characteristic losses in HTS materials.

* * * * *